United States Patent [19]
Campi

[11] 4,021,760
[45] May 3, 1977

[54] EMP CIRCUIT BOARD FILTER USING MOV DEVICES

[75] Inventor: Morris Campi, Silver Spring, Md.

[73] Assignee: The United States of America as represented by the Secretary of the Army, Washington, D.C.

[22] Filed: Jan. 19, 1976

[21] Appl. No.: 650,350

[52] U.S. Cl. .......................... 333/70 R; 333/17 L; 333/79; 361/119

[51] Int. Cl.² .................................. H03H 13/00; H03H 7/10; H03H 7/14; H02H 3/27

[58] Field of Search ........ 333/79, 76, 70 R, 70 CR, 333/17 L; 317/50, 61, 61.5, 70, 256, 53; 338/21

[56] References Cited
UNITED STATES PATENTS

| | | | |
|---|---|---|---|
| 3,824,431 | 7/1974 | Schlicke | 317/61 |
| 3,842,374 | 10/1974 | Schlicke | 333/79 |
| 3,845,358 | 10/1974 | Anderson et al. | 317/61 |
| 3,863,111 | 1/1975 | Martzloff | 317/61.5 |

*Primary Examiner*—Paul L. Gensler
*Assistant Examiner*—Marvin Nussbaum
*Attorney, Agent, or Firm*—Nathan Edelberg; Robert P. Gibson; Saul Elbaum

[57] ABSTRACT

Two partial circular chips of metal oxide varistor (MOV) material are mounted in a TO-5 transistor case. Each chip acts as a capacitive element to ground for a low pass pi-filter network. An inductance, whose value is chosen for the required filter impedance and cut off frequency, is placed across the MOV chips and connected to TO-5 contacts, along with the MOV, completing the filter network. At normal signal levels, the package acts as a normal low-pass pi-filter network. At higher signal levels and transients, the bipolar MOV components clamp the voltage to a given level, determined by the MOV material grain structure and chip thickness.

5 Claims, 3 Drawing Figures

EMP CIRCUIT BOARD FILTER USING MOV DEVICES

RIGHTS OF THE GOVERNMENT

The invention described herein may be manufactured, used, and licensed by or for the United States Government for governmental purposes without the payment to me of any royalty thereon.

FIELD OF THE INVENTION

The present invention relates to electrical surge protection, and more particularly to a filter, utilizing MOV devices for protecting against electromagnetic pulses, at the input of a communication terminal.

BRIEF DESCRIPTION OF THE PRIOR ART

Many telephone and teletype communication terminals include protective devices at the input thereof. A prevalent form of overvoltage or surge protection at such terminals includes an arc or lightning arrestor. Such an arrestor is usually followed by an electromagnetic interference (EMI) filter. The arrestor serves to suppress the effects of overvoltage, while the filter acts as a low pass filter to eliminate transient signals that would be inherent with EMI.

Although this approach is generally satisfactory, there is a limitation on the frequency and surge levels for which this prior art approach works. Thus, by way of example, in the environment of a nuclear blast, the electromagnetic pulse (EMP) signals are of sufficiently higher intensity and frequency content than the interference signals for which the prior art protective devices have been designed. Thus, in the environment of a nuclear blast, the arc or lightning arrestors would not be capable of suppressing high frequency and high level EMP. As a result, the conventional EMI filter would be destroyed thereby open circuiting a communication link to a connected terminal.

MOV devices have been used as voltage clamping devices. However, the inherent capacitance of these devices limits their utilization to relatively low frequencies, that is up to approximately 1 MHz. Thus, the utilization of these devices has not been recognized for high frequency overvoltage signals with which the present invention is concerned.

BRIEF DESCRIPTION OF THE PRESENT INVENTION

The present invention utilizes the inherent capacitance of an MOV device, with its voltage clamping capability, as a means for creating a capacitive filter element, which may be combined with other filter elements, such as inductors, for creating an extemely effective low pass filter for surge protection. As a means for illustrating the concept, a pi-filter has been chosen as an illustrative embodiment. By developing a filter configuration using MOV devices, a surge protector is developed which has a faster high frequency roll off than would be possible by using an MOV device as a two-terminal component connected across the input of a communication terminal for voltage clamping performance. The same fast frequency roll off as well as the filter configuration capability of clamping high voltage transients makes the present invention far superior to the prior art scheme of connecting an arc or lightning arrestor in series with an EMI filter.

The present invention is specifically directed to the packaging of a surge protector or line filter in a package that is suitable for circuit board use. In particular, the filter components are mounted, in an illustrative embodiment, to a TO-5 package having leads that are particularly suited for connection with circuit board components.

BRIEF DESCRIPTION OF THE FIGURES

The above-mentioned objects and advantages of the present invention will be more clearly understood when considered in conjunction with the accompanying drawings, in which.

DETAILED DESCRIPTION OF THE INVENTION

Figure 1:
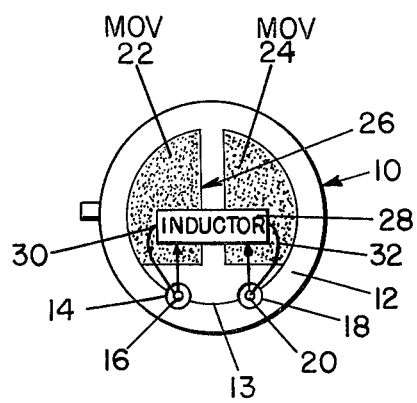
FIG. 1 is a top plan view of a filter utilizing the invention.

Referring to the figures and more particularly FIG. 1 thereof, reference numeral 10 generally indicates the support member which mounts individual components thereon. The support member 10 includes an enlarged shoulder 12, shown in greater detail in FIG. 3. The support member is identical to that used to a TO-5 transistor package. A second shoulder 13 of lesser diameter articulates from the shoulder 12. Electrical leads 16 and 20 pass through the shoulders 12 and 13 to the illustrated upper end of the support member. As shown in FIG. 1, each of the leads 16 and 20 are embedded in an insulator cement, such as epoxy. This is signified by reference numerals 14 and 18 in FIG. 1. A third lead 36, illustrated in FIG. 3, is a ground lead to the support member 10.

Figure 2:
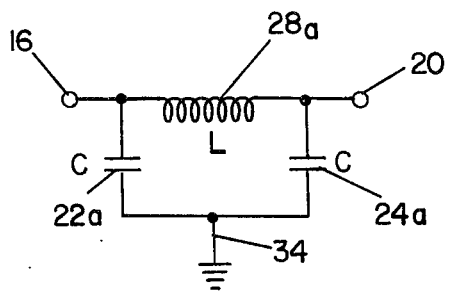
FIG. 2 is an electrical equivalent diagram of the filter shown in FIG. 1.
Figure 3:
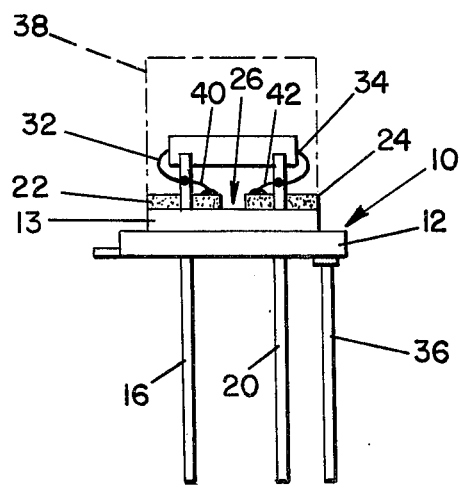
FIG. 3 is an elevational view of the filter shown in FIG. 1.

Segments of metal oxide material, as illustrated by reference numerals 22 and 24, are properly cemented to the shoulder 13, as shown in FIGS. 1 and 3. The metal oxide segments are of the MOV variety (metal oxide varistor). A gap 26 separates confronting edges of the MOV segments 22 and 24. Each of these segments acts as a capacitive element to ground for the low pass pi-filter network shown in FIG. 2. An inductor 28, of the discrete variety, has a value which is chosen for the required filter impedance and cut off frequency. The inductor is placed across the MOV segments and has its leads 32 and 34 connected to the TO-5 contacts 16 and 20. These contacts are also electrically connected to the MOV segments 22 and 24, by means of short electrical leads 40 and 42.

Although the illustrated embodiment illustrates a discrete inductor, it is completely within the purview of the invention to have a thick film inductance, or the like, suitably cemented or attached to the shoulder 13.

A Hi-Hat can 38 may be finally positioned over the support member 10 to encapsulate the circuitry.

FIG. 2 illustrates the electrical equivalent low pass pi-filter network. The inductor and capacitors are similarly numbered to the actual structural components shown in FIGS. 1 and 3, with the inclusion of the letter suffix a. Similarly, the input and output of the two port network of FIG. 2 is numbered to match similar points of the structure shown in FIGS. 1 and 3. The ground point 34, shown in FIG. 2, corresponds with the shoulder 13 in FIGS. 1 and 3.

At normal signal levels, the illustrated package acts as a normal low-pass pi-filter network. At higher signal levels and transients, the bipolar MOV components clamp the voltage to a given level, determined by the MOV material grain structure and segment thickness.

The adaptation of the present invention to a TO-5 renders the present filter to applications involving circuit boards. Accordingly, the present invention has wide application in surge protection of sensitive circuits.

Although the invention has been discussed in terms of a low pass pi-filter network including LC components, it is to be appreciated that other configurations of capacitive networks may be formed. It is to be stressed that the primary inventive concept is the utilization of MOV devices in a filter configuration wherein the inherent capacitance of the MOV may be utilized to effect relatively fast high frequency roll off as well as voltage clamping capability for a relatively high level transient signal.

It should be understood that the invention is not limited to the exact details of construction shown and described herein for obvious modifications will occur to persons skilled in the art.

I claim the following:

1. A filter for protecting circuits from over-voltage surges, the filter comprising:

supporting means for mounting filter components thereon wherein the supporting means includes a planar shoulder for mounting;

a plurality of MOV segments mounted on the planar shoulder, the segments positioned in spaced relation to each other to create respective capacitances for the filter;

at least one inductance mounted on the planar shoulder, adjacent the MOV segments;

electrodes attached to the supporting means and extending outwardly therefrom; and means for connecting the MOV segments and the inductance to preselected electrodes for completing a filter configuration therebetween wherein the connecting means include two outwardly extending leads from the inductance to a first and second preselected electrodes and includes leads connecting each segment with a preselected electrode.

2. The subject matter set forth in claim 1 wherein two MOV segments are positioned in coplanar spaced relationship to each other for creating two capacitances with respect to a grounded supporting means.

3. The subject matter set forth in claim 2 wherein the inductance is a discrete electrically connected between the MOV segments for creating a low pass pi-filter.

4. The subject matter set forth in claim 3 wherein the supporting means comprises a TO-5 package.

5. The subject matter set forth in claim 4 together with a Hi-Hat can positioned over the MOV segments and the inductor for encapsulated protection thereof.

* * * * *